United States Patent
Apel

(10) Patent No.: US 7,728,662 B2
(45) Date of Patent: Jun. 1, 2010

(54) SATURATED POWER AMPLIFIER WITH SELECTABLE AND VARIABLE OUTPUT POWER LEVELS

(75) Inventor: Thomas R. Apel, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/666,542

(22) Filed: Sep. 19, 2003

(65) Prior Publication Data
US 2004/0108900 A1 Jun. 10, 2004

Related U.S. Application Data

(60) Provisional application No. 60/422,984, filed on Nov. 1, 2002, provisional application No. 60/412,342, filed on Sep. 20, 2002.

(51) Int. Cl.
*H03K 19/094* (2006.01)
(52) U.S. Cl. .............................. 330/124 R; 330/124 D; 330/296; 330/302
(58) Field of Classification Search ............. 330/124 R, 330/124 D, 295, 51, 130, 133, 134, 302, 296; 318/678
See application file for complete search history.

(56) References Cited

U.S. PATENT DOCUMENTS

| | | | | |
|---|---|---|---|---|
| 4,189,732 A | * | 2/1980 | Atwater | 343/5 R |
| 5,162,756 A | * | 11/1992 | Taniguchi et al. | 330/295 |
| 5,541,554 A | | 7/1996 | Stengel et al. | |
| 5,880,633 A | | 3/1999 | Leizerovich et al. | |
| 5,886,575 A | | 3/1999 | Long | |
| 6,069,525 A | * | 5/2000 | Sevic et al. | 330/51 |
| 6,137,355 A | | 10/2000 | Sevic et al. | |
| 6,262,629 B1 | | 7/2001 | Stengel et al. | |
| 6,329,877 B1 | | 12/2001 | Bowen et al. | |
| 6,359,514 B1 | | 3/2002 | King et al. | |
| 6,374,092 B1 | | 4/2002 | Leizerovich et al. | |
| 6,894,561 B2 | * | 5/2005 | Apel | 330/51 |
| 2002/0093383 A1 | | 7/2002 | Thompson | |
| 2002/0132652 A1 | | 9/2002 | Steel et al. | |
| 2002/0135425 A1 | | 9/2002 | Kim et al. | |
| 2002/0190790 A1 | * | 12/2002 | Cheng et al. | 330/51 |

OTHER PUBLICATIONS

Holt "Electronic Circuits" John Wiley & Sons 1978 p. 500.*
Holt (Holt II) "Electronic Digital and Analog Circuits", John Wiley and Sons 1978 pp. 83-90 and 94-96.*
Millman "Micro-Electronics Digital aned Analog Circuits and Systems", McGraw-Hill Book Company 1979 pp. 74-77.*

* cited by examiner

*Primary Examiner*—Michael B Shingleton
(74) *Attorney, Agent, or Firm*—Bever, Hoffman & Harms LLP

(57) ABSTRACT

A power amplifier circuit includes two amplifier subsections and delay elements coupled in parallel. An input received by the second amplifier subsection is a delayed version of the input received by the first amplifier subsection. The output of the first amplifier subsection is delayed such that the delayed output of the first amplifier subsection is in phase with the output of the second amplifier subsection. For low output power operation, only the first amplifier subsection is enabled. For high output power operation, both the first and the second amplifier subsections are enabled. The first and the second amplifier subsections operate as saturated amplifiers. A first variable output power control signal controls the output power of the first amplifier subsection, and a second variable output power control signal controls the output power of the second amplifier subsection.

20 Claims, 4 Drawing Sheets

SATURATED POWER AMPLIFIER WITH SELECTABLE AND VARIABLE OUTPUT POWER LEVELS

RELATED APPLICATIONS

This application claims priority from provisional U.S. Patent Application No. 60/422,984 entitled "SATURATED POWER AMPLIFIER WITH MULTIPLE OUTPUT POWER LEVELS" filed Nov. 1, 2002 by Thomas R. Apel, and from provisional U.S. Patent Application No. 60/412,342 entitled "EFFICIENT POWER CONTROL BY PERIPHERY SWITCHING" filed Sep. 20, 2002 by Thomas R. Apel, both of which are incorporated herein by reference.

BACKGROUND

1. Field of the Invention

This invention is related to electronic power amplifiers (PAs), and more particularly to radio frequency (RF) or saturated power amplifiers with multiple, selectable output power levels.

2. Related Art

Electronic amplifiers receive an input signal and provide an output signal that is typically a larger magnitude version of the input signal. As is well-known, class A, class AB, class B, or class C amplifiers are broad general categories of electronic amplifiers (there are also switching-mode amplifiers, such as class D, class E, class F2, etc.). The class A and AB amplifiers operate in a linear manner, while the class B and C amplifiers operate in a non-linear manner. The class A, AB, B, and C designations are generally determined by the position of the quiescent current point (Q-point) on the amplifier's load line, as set by a particular amplifier bias setting. The Q-point position is set by bias levels (e.g., voltages) applied to the electronic amplifier circuit components. These amplifier classifications apply to small signal inputs to wideband (untuned) amplifiers.

A tuned amplifier is an electronic amplifier that is configured to provide a maximum gain at a particular input signal frequency. For example, a tuned RF amplifier provides a maximum gain at a particular RF operating frequency or at a frequency within a particular RF operating frequency band (e.g., a cellular telephony (wireless) frequency band designated for operation by a government agency). The amplifier is tuned to provide maximum gain at the desired frequency by resonating capacitance with inductance in the amplifier circuit.

In an ideal amplifier, the output signal waveform exactly corresponds to the input signal waveform (i.e., a linear relationship), except that the output signal waveform is increased in amplitude and possibly time-delayed (phase shifted). All real world amplifiers, however, distort the input signal during amplification such that there is at least a small degree of non-linearity between the amplifier's output signal and the driving input signal. For example, distortion can occur because of the amplifier's inherent characteristics (e.g., non-linear signal response during operation) or because of extraneous signals affecting the output signal (e.g., noise).

In wireless (e.g., radio) communications systems, the signal carrying information being transmitted is typically a byproduct of a carrier signal component and a modulating signal component. The modulating signal carries the transmitted information and is used to alter (modulate) the carrier signal waveform. Various well-known modulation techniques include amplitude modulation (AM), frequency modulation (FM), pulse code modulation (PCM), Gaussian minimum shift keying (GMSK), and coded modulation schemes (e.g., coded orthogonal frequency division multiplexing (COFDM)). In wireless communication systems, both carrier signal and modulating signal distortion are important design factors. Since the modulating signal component of the signal being amplified carries the information, modulating signal distortion should be minimized.

Three types of distortion that are of interest in RF amplifiers are harmonic distortion of the input signal to the amplifier, amplitude distortion of the modulating signal component of the input signal (e.g., AM-AM envelope distortion), and phase distortion of the modulated signal due to input envelope changes (e.g., AM-PM distortion). Since amplifiers used in RF applications are typically tuned amplifiers, harmonic components of the input signal are suppressed to acceptable levels in the amplifier's output signal. But RF amplifiers must amplify the input signal such that the modulating component in the amplified output signal is acceptably linear (acceptably distortion-free). If not driven into saturation by the input signal, both class A and class AB tuned RF amplifiers typically provide the required modulating signal component linearity for modern wireless power amplification applications (e.g., amplifying cellular telephone signals for transmission by the handset).

A saturated amplifier is an amplifier (regardless of amplifier class rating) that is operated with high input signal overdrive such that the amplifier is severely voltage limited. That is, in a saturated amplifier, the output signal voltage is limited by the supply voltages applied to the amplifier (i.e., the top-rail and bottom-rail voltages). Therefore, the amplified output voltage signal waveform is clipped. Both the output voltage and current are moving through the available extremes of the amplifying component(s) (e.g., in both the ohmic/high current regions and cutoff/high voltage region). A saturated amplifier is a non-linear amplifier (i.e., the output signal waveform is a clipped version of the input signal waveform). However, when using some modulation schemes where the envelope of the input signal is constant, the amplitude-limiting characteristic of a saturated amplifier is acceptable. Modulation methods of this type typically use phase or frequency variations to carry the modulated information signal. Low AM-PM distortion is important. Saturated amplifiers advantageously provide high DC operating power-to-RF output power efficiency with low AM-PM distortion.

The Doherty amplifier has been known since the 1930s, and was first applied to radio signal broadcasting. The Doherty amplifier includes a carrier amplifier and a peaking amplifier, which operate in response to a variable amplitude input signal. When the envelope peaks of the input signal are less than an input threshold, the carrier amplifier operates in a non-saturated linear manner and provides low power amplification. The peaking amplifier is disabled at this time. When the envelope peaks of the input signal are greater than the input threshold, the carrier amplifier operates in a saturated mode, and the peaking amplifier is enabled. The peaking amplifier is biased for class B and/or class C bias operation. The peaking amplifier never saturates in the classic Doherty amplifier.

Electric power available to portable wireless (e.g., radio) transceivers (e.g., cellular telephone handsets) is typically limited by battery life and desired talk-time. Of the electronic components in such transceivers, the power amplifier in the transmitter section typically consumes the most electric power. As such transceivers are increasingly miniaturized, electric power consumption becomes a critical design consideration, because long battery life is desirable. Some transceivers have transmitter sections that output signals at selectable power levels. For example, in a typical cellular telephone handset operating under the Global System for Mobile Communications (GSM), the power of the RF input signal provided to the final stage amplifier of the transmitter is high and relatively constant. The output power of the final stage amplifier is controlled with an analog control signal. The output power of the final stage amplifier is reduced as the analog control signal is reduced, but since the battery voltage and power amplifier load impedance are constant, the DC to RF power efficiency is also reduced.

It is therefore desirable to have a saturated amplifier circuit that provides selectable output power levels and exhibits a high power efficiency over the desired range of power levels.

SUMMARY

Accordingly, the present invention provides a power amplifier circuit that includes a first amplifier subsection and a second amplifier subsection coupled in parallel between an input terminal and an output terminal. The first amplifier subsection is configured to receive an RF input signal, and in response, provide a first output signal. A first delay circuit is configured to introduce a first delay to the input signal, thereby creating a delayed input signal. The second amplifier subsection is configured to receive the delayed input signal, and in response, provide a first delayed output signal. An impedance inverter is configured to introduce a second delay to the first output signal, thereby creating a second delayed output signal. The first and second delayed output signals are combined, thereby creating an amplified RF output signal. The first and second delays are selected to be equal, such that the first and second delayed output signals are in phase.

The power amplifier circuit is enabled/disabled in response to an enable control signal. The output power level of the power amplifier circuit is controlled in response to an analog level control signal. When enabled, the power amplifier circuit operates in a low power range or a high power range, in response to the analog level control signal. When operating in the low power range, the first amplifier subsection is enabled to operate in a saturated mode and the second amplifier subsection is disabled. When operating in the high power range, both the first and second amplifier subsections are enabled to operate in a saturated mode.

A level control circuit is configured to provide a first output level control signal that causes the first amplifier subsection operate in a saturated mode when the first amplifier subsection is enabled, and a second output level control signal that causes the second amplifier subsection to operate in a saturated mode when the second amplifier subsection is enabled. The level control circuit operates in response to the analog level control signal and the amplifier enable signal. By operating the first and second amplifier subsections in a saturated mode, a high efficiency is advantageously obtained.

The power amplifier circuit further includes bias control circuitry configured to independently enable and disable the first and second amplifier subsections. In one embodiment, the bias control circuitry includes a bias control circuit configured to generate a first bias voltage and a second bias voltage in response to an internal mode signal. The internal mode signal identifies the low power range or the high power range. The first bias voltage is applied to the first amplifier subsection and the second bias voltage is applied to the second amplifier subsection.

When the amplifier enable signal is activated and the analog level control signal is in the low power portion of the control range, the bias control circuitry activates the first bias voltage and deactivates the second bias voltage, thereby enabling the first amplifier subsection and disabling the second amplifier subsection. When the enable signal identifies the high power portion of the control range, the bias control circuitry activates both the first and second bias voltages, thereby enabling the first and second amplifier subsections.

Thus, the power amplifier circuit of the present invention combines the high efficiencies of a Doherty amplifier topology and a saturated amplifier. In addition, the power consumption of the power amplifier circuit is further reduced at low output power levels by disabling the second amplifier subsection.

The first amplifier subsection can be implemented by a bipolar transistor having a collector coupled to the top rail voltage supply terminal through a first control transistor. When the first control transistor is turned on, a regulated output voltage, controlled by the analog control voltage, is obtained from the top supply rail. A similar configuration can be used to implement the second amplifier subsection.

The present invention will be more fully understood in view of the following description and drawings.

DETAILED DESCRIPTION

Figure 1:
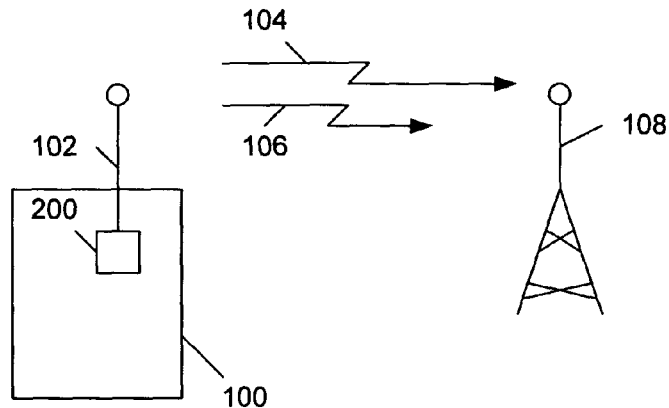
FIG. 1 is a block diagram of a cellular telephone handset and a receiving antenna in accordance with one embodiment of the present invention.

Skilled artisans will understand that certain well-known electronic circuit features (e.g., power supply lines) have been omitted so as to more clearly illustrate embodiments of the invention. Like-numbered elements in the drawings refer to the same or substantially similar elements among the various embodiments. For example, embodiments are generally described in terms of bipolar junction transistor (BJT) technology (e.g., multi-cell heterojunction bipolar junction transistors (HBTs)), but skilled artisans will understand that field effect transistor (FET) technology or even vacuum tube technology is easily adapted to the disclosed circuit topologies. For instance, an FET or vacuum triode may be substituted for a BJT.

Some embodiments are formed on a gallium arsenide (GaAs) substrate using conventional GaAs fabrication. Other semiconductor materials (e.g., silicon, indium phosphide) are used in other embodiments.

FIG. 1 is a block diagram of a cellular telephone handset 100 and a receiving antenna 108 in accordance with one embodiment of the present invention. Cellular telephone transceiver handset 100 includes final stage electronic power amplifier 200. Power amplifier 200 provides variable and selectable output power levels to antenna 102 such that an illustrative variable high power wireless signal 104 or an illustrative variable low power wireless signal 106 is transmitted to receiving antenna 108. A filter and duplexer and/or switch (not shown) are typically located between power amplifier 200 and antenna 102.

Figure 2:
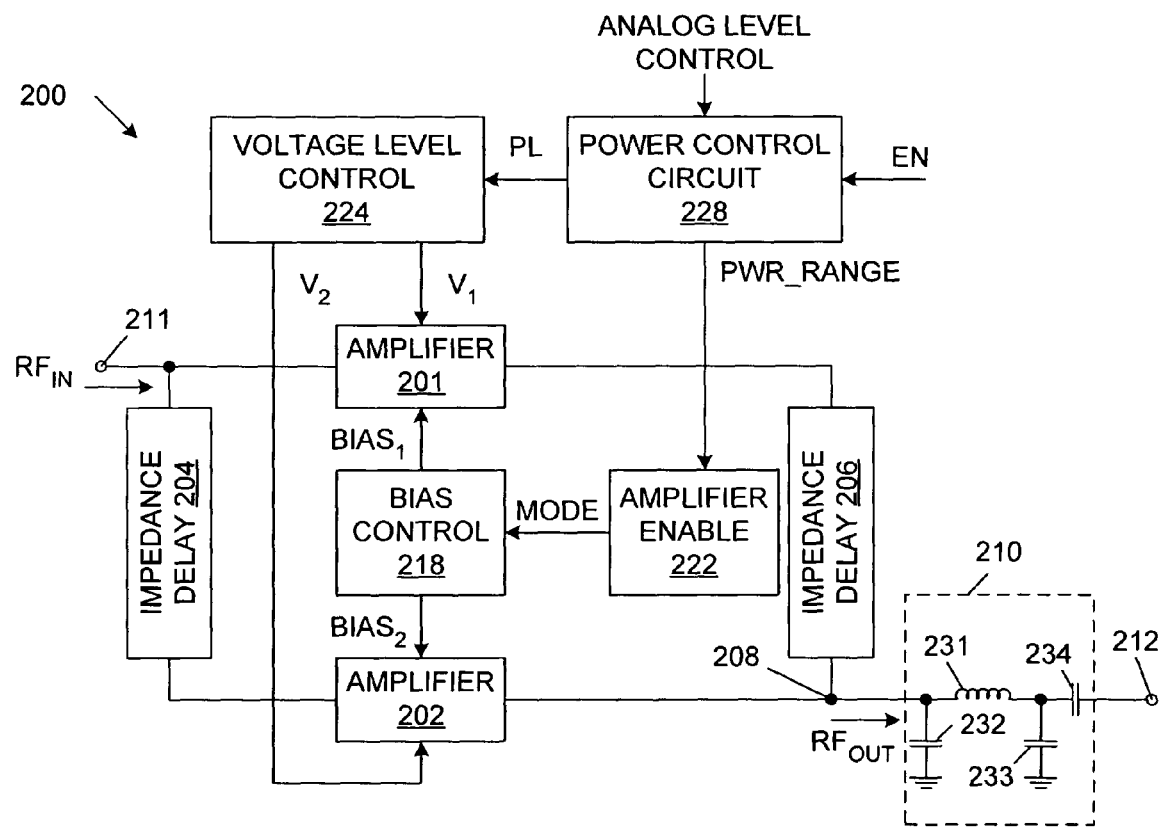
FIG. 2 is a block diagram of a power amplifier circuit having a low power control range and a high power control range, in accordance with one embodiment of the present invention.

FIG. 2 is a block diagram of power amplifier circuit 200, in accordance with one embodiment of the present invention. Power amplifier circuit 200 includes low power amplifier subsection 201, high power amplifier subsection 202, impedance match circuit 210, input terminal 211, output terminal 212, delay element 204, impedance inverter 206, intermediate output node 208, bias control circuit 218, amplifier enable circuit 222, voltage level control circuit 224 and power control circuit 228.

As shown in FIG. 2, the output signals from amplifier subsections 201 and 202 are combined at the intermediate output node 208. Amplifier subsections 201-202 are illustrative of many different BJT or FET amplifiers, including cells in a single HBT. Amplifier subsections 201-202 are further illustrative of two or more amplifiers coupled in phase to produce a common output signal (e.g., multiple cells in an HBT are paralleled to form amplifier subsection 201 and amplifier subsection 202).

As shown in FIG. 2, a radio frequency input signal $RF_{IN}$ is applied to input terminal 211. As will become apparent in the following description, in accordance with one embodiment of the present invention, the $RF_{IN}$ signal has a power high enough to cause amplifier subsection 201 and amplifier subsection 202 to always operate in a saturated mode. As a result, power amplifier circuit 200 exhibits a relatively high power efficiency.

Amplifier subsection 201 is directly coupled to input terminal 211, such that this amplifier subsection 201 receives the $RF_{IN}$ signal from input terminal 211. Amplifier subsection 202 is coupled to input terminal via delay element 204, such that this amplifier subsection 202 receives a delayed version of the $RF_{IN}$ signal. That is, amplifier subsection 202 receives a delayed version of the input signal received by amplifier subsection 201. As shown in FIG. 2, the output terminal of amplifier subsection 201 is coupled to intermediate output node 208 via impedance inverter 206. Impedance inverter 206 introduces a delay to the output signal provided by amplifier 201. The output terminal of amplifier subsection 202 is directly coupled to intermediate output node 208. The signal delay introduced by delay element 204 is selected to be substantially equal to the signal delay introduced by impedance inverter 206. As a result, the output signals provided by amplifier subsections 201 and 202 arrive at intermediate output node 208 in phase. A radio frequency output signal $RF_{OUT}$ is provided from intermediate output node 208 to output terminal 212 via impedance match circuit 210, which includes inductor 231 and capacitors 232-234. The particular form of impedance match circuit 210 is not essential to the invention since this circuit 210 simply transforms the load at output terminal 212 to the loading level at intermediate output node 208. Without 210, the essential aspects of the invention are unchanged.

In one embodiment, the $RF_{OUT}$ signal drives an antenna (e.g., antenna 102) as a load. Thus, the impedance of match circuit 210 is designed to match the impedance associated with the antenna.

In one embodiment, delay element 204 and impedance inverter 206 are LC circuits, although in other instances various other delay devices and impedance inverters (e.g., quarter-wavelength delay lines) may be used.

Amplifier subsection 201 receives amplifier bias signal $BIAS_1$ from bias control circuit 218. As described in more detail below, the $BIAS_1$ signal is a DC bias voltage applied to the base of an amplifying transistor in amplifier subsection 201. Similarly, amplifier subsection 202 receives amplifier bias signal $BIAS_2$ from bias signal 218. As described in more detail below, the $BIAS_2$ signal is a DC bias voltage applied to the base of an amplifying transistor in amplifier subsection 202. The $BIAS_1$ and $BIAS_2$ signals are generated in one of two discrete states. If the bias signals $BIAS_1$ and $BIAS_2$ are activated to a first state, then the corresponding amplifier subsections 201 and 202 are enabled. If the bias signals $BIAS_1$ and $BIAS_2$ are de-activated to a second state, then the corresponding amplifier subsections 201 and 202 are disabled.

In accordance with the described embodiment, power amplifier circuit 200 is capable of operating over the full power control range by partitioning the operation into two sub-ranges. The bias and control modes associated with the low and high power portions of the power control range will be referred to as the low power mode (or range) and the high power mode (or range), respectively. In the low power mode, bias control circuit 218 activates the $BIAS_1$ signal in the first state, and deactivates the $BIAS_2$ signal in the second state, thereby enabling amplifier subsection 201 and disabling amplifier subsection 202. In the high power mode, bias control circuit 218 activates both the $BIAS_1$ and $BIAS_2$ signals in the first state, thereby enabling both amplifier subsections 201 and 202. When enabled, amplifier subsections 201 and 202 are biased to operate as deep class AB (approaching class B) amplifiers, and are saturated when driven by the input signal $RF_{IN}$. As described in more detail below, this saturated mode of operation is achieved by controlling the collector voltages applied to amplifier subsections 201 and 202.

Bias control circuit 218 is controlled by an internal mode signal (MODE) generated by amplifier enable circuit 222. The value of the internal mode signal determines the states of bias signals $BIAS_1$ and $BIAS_2$. Amplifier enable circuit 222 provides a MODE signal having a first state when amplifier 200 is to be operated in the low power mode, and a MODE signal having a second state when power amplifier 200 is to be operated in the high power mode. In one embodiment, the MODE signal has a third state when power amplifier circuit 200 is to be disabled. In this embodiment, the MODE signal is a multiple bit signal. Amplifier enable circuit 222 determines whether power amplifier circuit 200 is to be operated in the low power bias mode or the high power bias mode in a conventional manner (e.g., in response to a control signal which identifies the low/high power mode). Note that amplifier enable circuit 222 is controlled by a power range mode select signal (PWR_RANGE) that is obtained from power control circuit 228. Power control circuit 228 determines whether the analog level control signal is in the low or high power portion of the power control range and sets the PWR_RANGE signal accordingly.

Voltage level control circuit 224 is coupled to provide output power level voltages $V_1$ and $V_2$ to amplifier subsections 201 and 202, respectively. As described in more detail below, output power level voltage $V_1$ is provided to a collector of a BJT amplifying transistor, or the drain of an FET amplifying transistor within amplifier subsection 201. Similarly, output power level voltage $V_2$ is provided to a collector of a BJT amplifying transistor, or the drain of an FET amplifying transistor within amplifier subsection 202. As described below, the output power level voltages $V_1$ and $V_2$ determine the output power of the $RF_{OUT}$ signal. Output power level voltages $V_1$ and $V_2$ are controlled by the analog level control signal.

More specifically, voltage level control circuit 224 generates the output power level voltages $V_1$ and $V_2$ in response to a power level control signal PL provided by power control circuit 228. Thus, voltage level control circuit 224 generates output power level voltage $V_1$ for amplifier subsection 201 and output power level voltage $V_2$ for amplifier subsection 202, in response to power level control signal PL received from power control circuit 228. In the described embodiment, power control circuit 228 provides the power level control signal PL in response to the analog level control signal and the amplifier enable signal EN. However, power control circuit 228 can be controlled by other signals in other embodiments.

Figure 3:
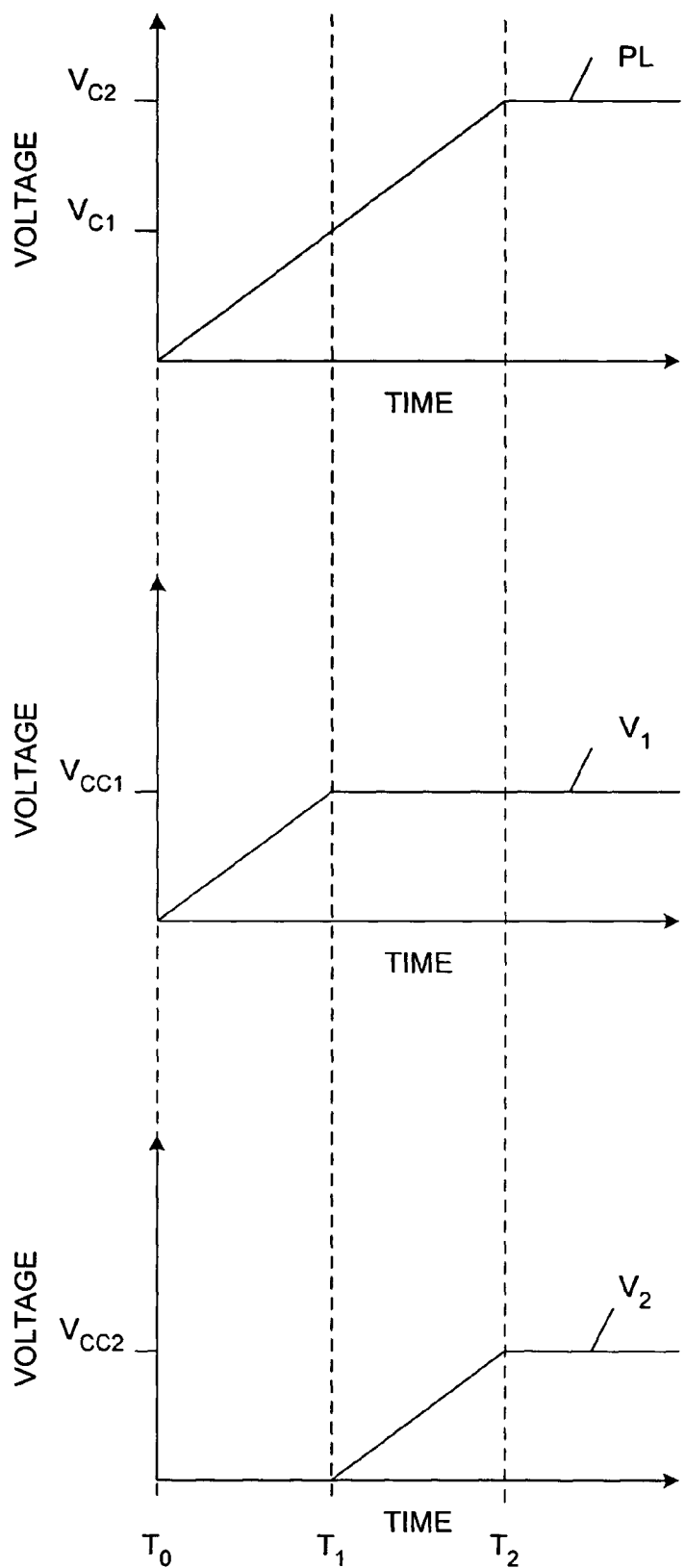
FIG. 3 is a waveform diagram illustrating a power level control signal, a first output power level voltage, and a second output power level voltage with respect to time, in accordance with one embodiment of the present invention.

FIG. 3 is a waveform diagram illustrating the power level control signal PL, the output power level voltage $V_1$, and the output power level voltage $V_2$ with respect to time, in accordance with one embodiment of the present invention. In the described embodiment, the PL, $V_1$ and $V_2$ signals are continuously variable, and the power level control signal PL tracks the analog level control signal. In other embodiments, these signals can represent a series of small discrete voltage steps.

At time $T_0$, power amplifier circuit 200 is off, and the PL, $V_1$ and $V_2$ signals all have a voltage of 0 Volts. At this time, the enable signal EN is in the third state and the $BIAS_1$ and $BIAS_2$ signals are de-activated, such that amplifier subsections 201 and 202 are disabled.

When it is desired to operate power amplifier circuit 200, the external enable signal EN is activated. Immediately after time $T_0$, the analog level control signal begins to ramp up. The presence of a non-zero analog level control voltage causes power control circuit 228 to provide a PWR_RANGE signal having a first state to amplifier enable circuit 222, thereby enabling the low power mode. At this time, the $BIAS_1$ signal is activated, thereby enabling amplifier subsection 201. In addition, power control circuit 226 increases the voltage of the PL signal from 0 Volts at time $T_0$, to a voltage of $V_{C1}$ at time $T_1$ under the control of the analog level control signal. In response, voltage level control circuit 224 causes the output power level voltage $V_1$ to increase to a first voltage level $V_{CC1}$ at time $T_1$. The $V_{CC1}$ voltage level is selected to ensure that the associated amplifier subsection 201 operates in a saturated mode and provides the desired power output. Voltage level control circuit 224 maintains the output power level voltage $V_2$ at a voltage of 0 Volts as long as the low power mode is active (e.g., until time $T_1$). As a result, amplifier subsection 202 remains disabled at time $T_1$. Because amplifier 201 is the only amplifier enabled at time $T_1$, power amplifier circuit 200 provides an output signal $RF_{OUT}$ having a relatively low power at time $T_1$. However, because amplifier subsection 201 operates in a saturated mode, the efficiency of power amplifier circuit 200 is relatively high. Note that power amplifier circuit 200 can advantageously operate in a saturated mode at all power levels represented by the low power mode in the range between $T_0$ to $T_1$. Analog control over the output power level is provided in response to the analog level control signal.

Immediately after time $T_1$, due to a further increase in the analog level control voltage, power control circuit 228 activates the PWR_RANGE signal to a second state, thereby enabling the high power mode. At this time, the $BIAS_1$ and $BIAS_2$ signals are both activated, thereby enabling amplifier subsections 201 and 202 during the time interval between times $T_1$ and $T_2$. In addition, in response to the increasing analog level control signal, power control circuit 228 increases the voltage of the PL signal from $V_{C1}$ Volts at time $T_1$, to a voltage of $V_{C2}$ at time $T_2$. In response, voltage level control circuit 224 causes the output power level voltage $V_2$ to increase from 0 Volts at time $T_1$, to a second voltage level $V_{CC2}$ at time $T_2$. Voltage level control circuit 224 further causes the output power level voltage $V_1$ to remain at the $V_{CC1}$ voltage level. The $V_{CC2}$ voltage level is selected to ensure that the associated amplifier subsection 202 operates in a saturated mode and provides the desired power output. Because both amplifier subsections 201 and 202 are enabled after time $T_1$, power amplifier 200 provides an output signal $RF_{OUT}$ having a relatively high power at time $T_2$. However, because these amplifier subsections 201 and 202 operate in a saturated mode, the efficiency of power amplifier circuit 200 is relatively high. Note that power amplifier circuit 200 can advantageously operate in a saturated mode at all power levels represented by the high power mode in the range between $T_1$ to $T_2$. Analog control over the output power level is provided in response to the analog level control signal.

In one illustrative embodiment, the $V_{CC1}$ and $V_{CC2}$ voltage levels are equal to the highest power supply voltage ("top-rail"; e.g., +3.3 V) available in a portable cellular telephone transceiver handset.

Referring again to FIG. 2, power amplifier circuit 200 is illustratively operated with input signal $RF_{IN}$ at a substantially constant power level. The value of input signal $RF_{IN}$ is sufficiently high to drive amplifier subsections 201 and 202 into saturation at all times (in connection with the above-described biasing provided by the $BIAS_1$, $BIAS_2$, $V_1$ and $V_2$ signals). The output power level of amplifier subsections 201 and 202 is controlled by varying the DC power supply voltages ($V_1$ and $V_2$) applied to each amplifier.

To summarize, bias control circuit turns off both amplifier subsections 201 and 202 to conserve battery power if power amplifier is not transmitting. Bias control circuit 218 turns on amplifier subsection 201, but not amplifier subsection 202, to conserve battery power if power amplifier circuit 200 is transmitting at low output power levels (as indicated by the analog level control signal). Bias control circuit 218 turns on both amplifier subsections 201 and 202 if power amplifier circuit 200 is transmitting at high output power levels (as indicated by the analog level control signal). To promote high efficiency (RF output power/DC power supplied), if amplifier subsection 201 is enabled, then this amplifier subsection 201 operates as a saturated amplifier, with the output power level controlled by output power level voltage $V_1$ (which is controlled by the analog level control signal). Likewise, if amplifier subsection 202 is enabled, then this amplifier subsection 202 also operates as a saturated amplifier, with the output power level controlled by output power level control voltage $V_2$ (which is controlled by the analog level control signal).

It is important to note that the low power to high power transition control is not obtained in response to envelope peaks in the $RF_{IN}$ signal that exceed a threshold level, as in a Doherty amplifier. Rather, the RF power output level is set in response to the analog level control signal by controlling the collector voltages and base bias voltages applied to the power amplifier subsections 201 and 202. Because amplifier subsections 201 and 202 are never operated out of saturation, there is no input threshold associated with power amplifier circuit 200.

Although FIG. 2 illustrates two amplifier subsections 201 and 202, it is understood that more than two amplifier subsections can be used in other embodiments of the present invention. Each of these additional amplifier subsections would be coupled to a corresponding delay element, bias control voltage and output power level voltages. In such embodiments, bias circuit 218 provides any additional required bias signals to enable or disable the various amplifier subsections in response to mode select signals provided by amplifier enable circuit 222.

Figure 4:
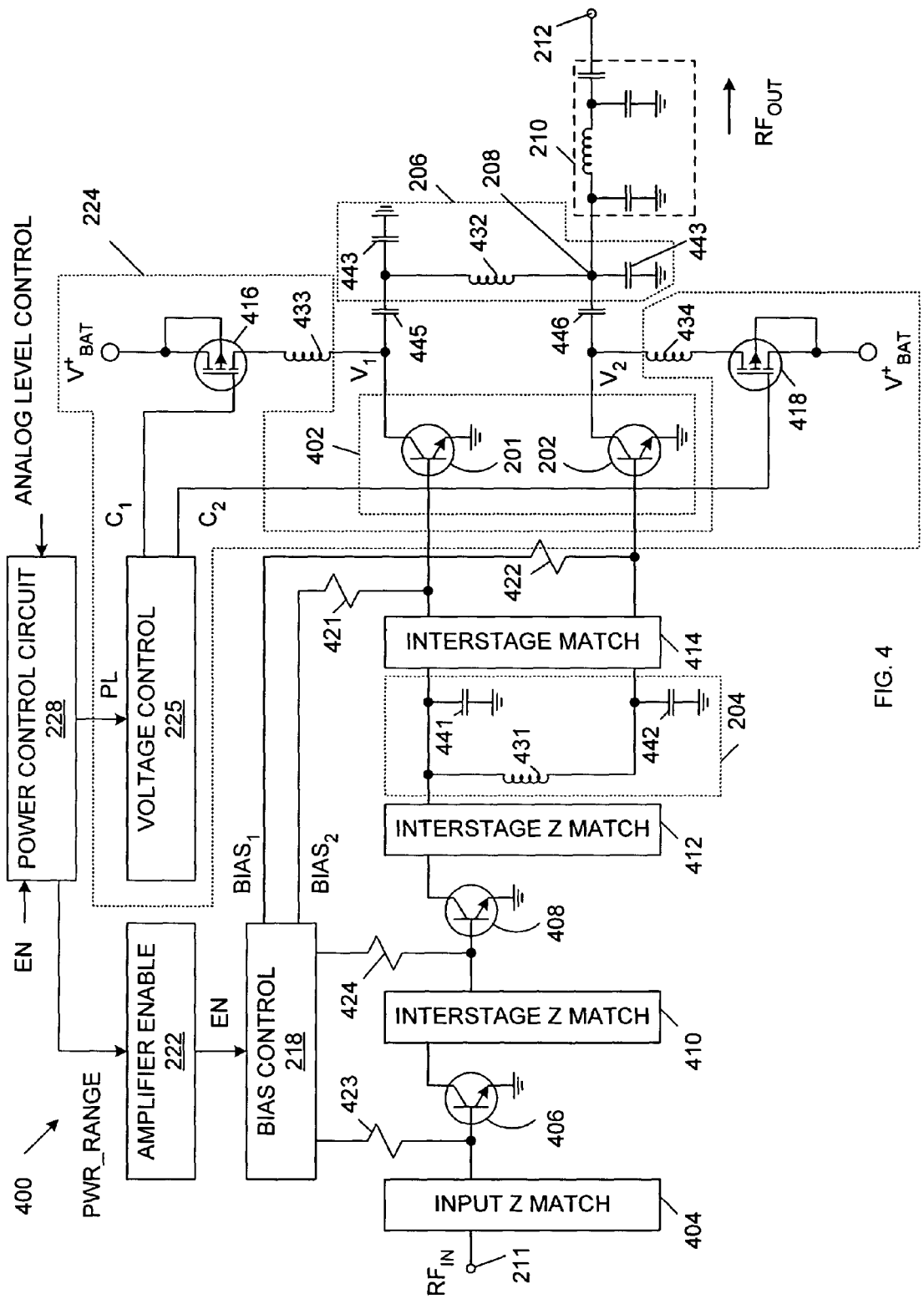
FIG. 4 is a circuit diagram of a power amplifier circuit having a low power control range and a high power control range in accordance with another embodiment of the present invention.

FIG. 4 is a circuit diagram of a power amplifier circuit 400 in accordance with another embodiment of the present invention. Power amplifier circuit 400 includes amplifier subsections 201-202, impedance match circuit 210, input terminal 211, output terminal 212, delay elements 204 and 206, intermediate output node 208, bias control circuit 218, amplifier enable circuit 222, voltage level control circuit 224 and power control circuit 228, which were described above in connection with FIG. 2. In the described power amplifier circuit 400, delay element 204 is an impedance inverter circuit implemented by inductor 431 and capacitors 441-442, and impedance inverter 206 is an impedance inverter circuit implemented by inductor 432 and capacitors 443-444. Voltage level control circuit 224 includes voltage control circuit 225, enhancement mode FETs 416 and 418 and inductors 433 and 434. In addition, power amplifier circuit 400 includes input impedance match circuit 404, amplifier stages 406 and 408, interstage impedance match circuits 410, 412 and 414, bias resistors 421-424 and capacitors 445-446.

Power amplifier circuit 400 is formed, for example, using GaAs integrated circuit technology. In the embodiment shown by FIG. 4, amplifier subsections 201 and 202 are cells in an HBT power amplifier 402. In some instances, amplifier subsections 201 and 202 are each a single HBT cell. In other instances, two or more HBT cells are combined to form each of amplifier subsections 201 and/or 202. In still other instances, amplifier subsections 201 and 202 can be implemented using other amplifying devices (e.g., BJTs, FETs). Additional output power levels can be obtained in embodiments where the component amplifying elements (e.g., multiple HBT cells) of amplifier subsections 201 and 202 are controlled with separate bias signals. For example, in an embodiment in which amplifier subsection 201 is implemented by a single HBT cell and amplifier subsection 202 is implemented by two HBT cells, a low output power level is obtained by enabling only the single HBT cell in amplifier subsection 201. A high output power level is obtained by enabling the single HBT cell in amplifier subsection 201 and both HBT cells in amplifier subsection 202. In the described embodiment, amplifier subsections 201 and 202 are biased to operate as deep class AB amplifiers.

Power amplifier 400 also includes intermediate stage amplifiers 406 and 408, which are implemented using single BJTs in the illustrated embodiment. However, those skilled in the art will understand that various amplifiers (e.g., FETs, operational amplifiers) may be used. Intermediate stage amplifiers 406 and 408 are typically operated as class AB amplifiers with sufficient gain to put amplifier 408 in voltage saturated operation.

Base bias resistors 421-424 are coupled between bias control circuit 218 and the bases of the transistors used to implement amplifier subsections 201-202 and amplifiers 406 and 424, respectively. Bias control circuit 218 applies a base bias voltage to amplifiers 406 and 408 whenever the mode select signal identifies either the low power mode or the high power mode. Although two intermediate stage amplifiers 406 and 408 are described in the present embodiment, it is understood that other numbers of intermediate stage amplifiers can be used in other embodiments of the present invention.

Input signal $RF_{IN}$ is received at input terminal 211, and is routed through input impedance match circuit 404 to first intermediate stage amplifier 406. The amplified output signal from first intermediate stage amplifier 406 is passed to second intermediate stage amplifier 408 via inter-stage impedance match circuit 410. The amplified output signal from second intermediate stage amplifier 408 is routed to amplifier subsections 201 and 202. More specifically, the amplified output signal from second intermediate stage amplifier 408 is routed to the base of amplifier subsection 201 via partial inter-stage impedance match circuits 412 and 414. The amplified output signal from second intermediate stage amplifier 408 is routed to the base of amplifier subsection 202 via partial inter-stage impedance match circuit 412, delay element 204, and partial inter-stage impedance match circuit 414.

In an illustrative embodiment, conventional LC circuits are used to implement impedance match circuits 404, 410, 412 and 414. Persons of ordinary skill in the art will understand that various other electrical circuit components may be used to implement these impedance match circuits.

The actual values of the inductors and capacitors of these LC circuits are set in accordance with the desired operating frequency of amplifier circuit 400 (e.g., about 850 MHz, or about 1.9 GHz).

The top rail voltage for amplifier subsections 201 and 202 is provided from a conventional battery (e.g., 3.3 Volt cellular telephone transceiver handset battery). The source electrodes of enhancement mode FETs 416 and 418 (depicted as PMOS transistors in FIG. 4) are connected to receive the top rail battery voltage, $V^+_{BAT}$. The drain electrode of FET 416 is coupled to the collector electrode of amplifier subsection 201 through inductor 433. Similarly, the drain electrode of FET 418 is coupled to the collector electrode of amplifier subsection 202 through inductor 434. Inductors 433 and 434 block the RF output signals provided by amplifier subsections 201 and 202, respectively. The gate electrodes of FETs 416 and 418 are coupled to receive control voltages $C_1$ and $C_2$, respectively, from voltage control circuit 225.

In the low power mode, voltage control circuit 225 provides a logic low $C_1$ control voltage and a logic high $C_2$ control voltage. Under these conditions, FET 416 is turned on and FET 418 is turned off. As a result, the output level control voltage $V_1$ is pulled up to a level between 0 Volts and $V^+_{BAT}$ depending on the desired power output, thereby enabling amplifier subsection 201 to operate in saturated mode. Conversely, output level control voltage $V_2$ is not pulled up, thereby disabling amplifier subsection 202.

In the high power mode, voltage control circuit 225 provides a logic low $C_1$ control voltage and a logic low $C_2$ control voltage. Under these conditions, FETs 416 and 418 are both turned on. As a result, the output level control voltage $V_1$ is pulled up to $V^+_{BAT}$, and the output level control voltage $V_2$ is pulled up to a voltage between 0 Volts and $V^+_{BAT}$, thereby enabling amplifier subsections 201 and 202 to operate in saturated mode.

The amplified RF signals provided by amplifier subsections 201 and 202 are combined at output terminal 208. The resulting output signal $RF_{OUT}$ is routed through output impedance match circuit 210 to output terminal 212.

The embodiment shown in FIG. 4 is illustrative of various other embodiments of the invention. For example, delay element 204 is shown in FIG. 4 as being positioned between partial inter-stage impedance match circuits 412 and 414. The partitioning of the inter-stage matching network into 412 and 414 typically occurs at an internal reference plane where the impedance at the input to network 414 is mostly real. In other instances, delay element 204 can be moved to other locations before one of the intermediate amplifiers 406 or 408.

Figure 5:
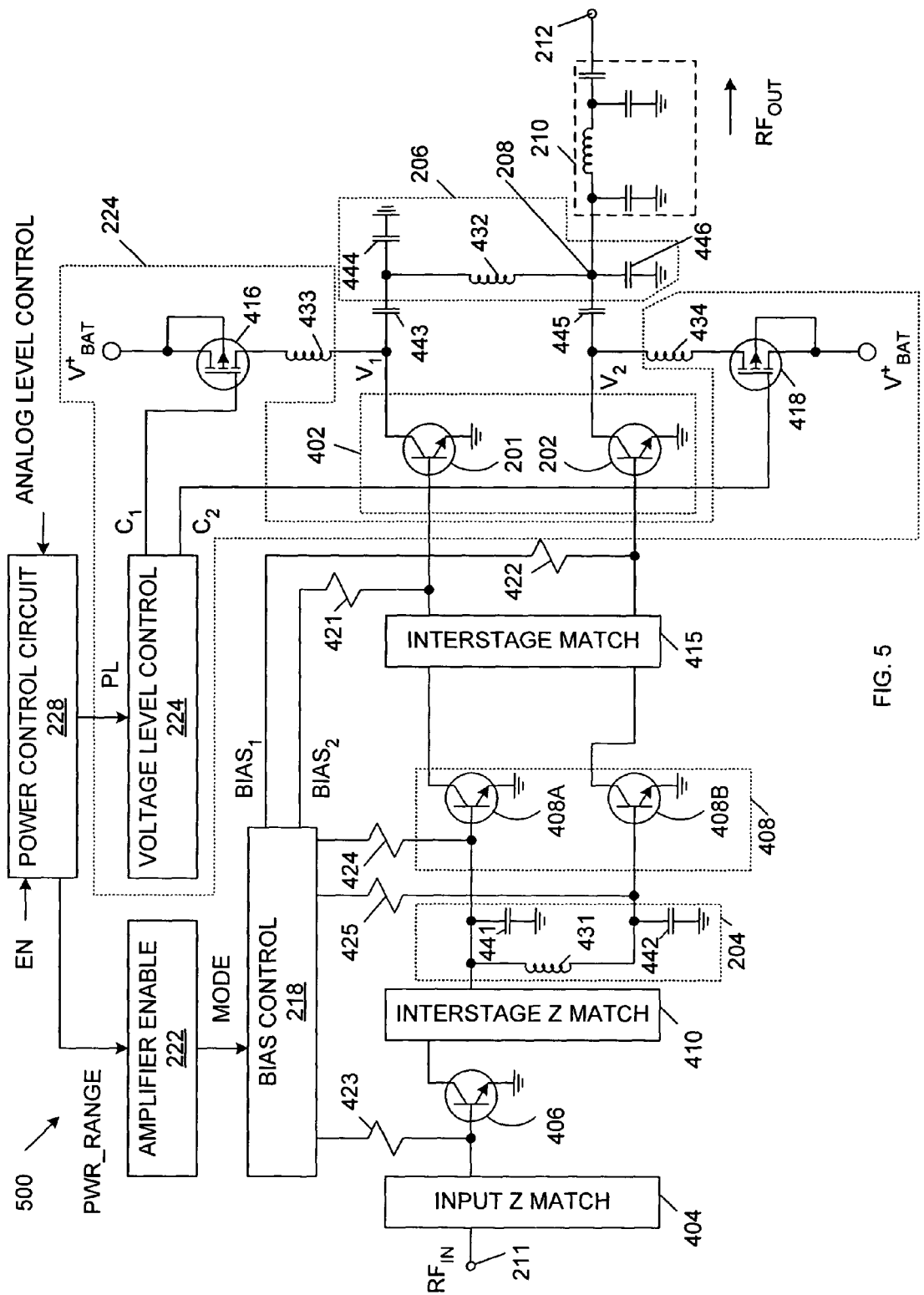
FIG. 5 is a circuit diagram of a power amplifier circuit having a low power control range and a high power control range mode, in accordance with another variation of the present invention.

FIG. 5 is a circuit diagram of a power amplifier circuit 500 that includes delay element 204 located between intermediate amplifiers 406 and 408. In this embodiment, amplifier 408 is modified to include amplifier subsections 408A and 408B.

Delay element 204 is coupled between the bases of amplifier subsections 408A and 408B. Note that bias resistor 424 is coupled between bias circuit 218 and the base of amplifier subsection 408A. An additional bias resistor 425 is added between bias circuit 218 and the base of amplifier subsection 408B. Partial inter-stage impedance match circuits 412 and 414 are replaced by a single inter-stage impedance match circuit 415. Power amplifier 500 operates in a manner similar to power amplifier 400 (FIG. 4).

Persons of skill in the art will understand that the invention has been described in terms of illustrative embodiments, but that many variations are possible. For instance, circuit topologies in accordance with the invention are not restricted to use as final stage power amplifiers, but may be used elsewhere in electronic circuits. Accordingly, the scope of the invention is limited only by the following claims.

I claim:

1. A power amplifier circuit comprising:
   a first transistor directly coupled to an input terminal, to receive a non-delayed input signal, and in response, provide an output signal;
   a delay circuit configured to introduce a first delay to the non-delayed input signal, thereby creating a delayed input signal, wherein the delayed input signal is delayed relative to the non-delayed input signal received by the first transistor;
   a second transistor coupled to the input terminal via the first delay circuit, to receive the delayed input signal, and in response, provide a first delayed output signal;
   an impedance inverter circuit coupled to the first transistor, to provide an impedance inversion and introduce a second delay to the output signal, thereby creating a second delayed output signal;
   a node connecting an output of the impedance inverter circuit and an output of the second transistor, the node configured to combine the first and second delayed output signals, thereby creating an amplified output signal;
   a level control circuit configured to provide a level control signal that causes the first transistor to become enabled in a low power mode, and causes the second transistor to become enabled in a high power mode; and
   a bias control circuitry to enable the first and second transistors in response-to the level control signal, wherein the bias control circuitry enables the first transistor to operate in a saturated mode when the level control signal indicates a low power mode, wherein the second transistor is disabled in the low power mode, and enables the second transistor to operate in the saturated mode when the level control signal indicates a high power mode, wherein both the first and second transistors are enabled in the high power mode.

2. The power amplifier of claim 1, wherein the bias control circuitry independently enables and disables the first and second transistors.

3. The power amplifier of claim 2, wherein the bias control circuitry comprises a bias control circuit configured to generate a first bias voltage and a second bias voltage in response to the level control signal, wherein the first bias voltage is applied to the first transistor and the second bias voltage is applied to the second transistor.

4. The power amplifier of claim 3, wherein the bias control circuit comprises:
   means for activating the first bias voltage and deactivating the second bias voltage when the level control signal identifies a low power mode; and
   means for activating both the first and second bias voltages when the level control signal identifies a high power mode.

5. The power amplifier of claim 1, wherein the level control signal is a ramp signal.

6. The power amplifier of claim 1, wherein the level control circuit comprises a first control transistor coupled between a collector of the first transistor and a voltage supply terminal.

7. The power amplifier of claim 6, further comprising an inductor coupled between the collector of the first transistor and the first control transistor.

8. The power amplifier of claim 6, wherein the level control circuit comprises a second control transistor coupled between a collector of the second transistor and the voltage supply terminal.

9. The power amplifier of claim 8, further comprising:
   an inductor coupled between the collector of the first transistor and the first control transistor; and
   an inductor coupled between the collector of the second transistor and the second control transistor.

10. The power amplifier of claim 1, wherein the delay circuit comprises an inductor and one or more capacitors.

11. The power amplifier of claim 10, wherein the impedance inverter circuit comprises an inductor and one or more capacitors.

12. The power amplifier of claim 1, wherein the first transistor comprises a heterojunction bipolar transistor, and wherein the second transistor comprises a heterojunction bipolar transistor.

13. The power amplifier of claim 1, wherein the first delay is equal to the second delay.

14. A method of amplifying an input signal, comprising:
   providing the input signal directly to a first transistor in a low power mode, wherein the input signal is non-delayed;
   applying a first bias voltage to a base of the first transistor to enable the first transistor in response to a level control signal;
   applying a first output level control signal to a collector of the first transistor to cause the first transistor to operate in saturated mode when the first transistor is enabled, such that the first transistor provides a first output signal in response to the non-delayed input signal;
   introducing a first delay to the non-delayed input signal, thereby creating a delayed input signal, wherein the delayed input signal is delayed relative to the input signal received by the first transistor;
   providing the delayed input signal to a second transistor;
   applying a second bias voltage to a base of the second transistor to enable the second transistor in response to an increase in the level control signal in a high power mode, to enable the second transistor to operate in a saturated mode, wherein the second transistor provides a first delayed output signal in response to the delayed input signal;.
   introducing a second delay to the first output signal, thereby creating a second delayed output signal; and
   combining the first and second delayed output signals at an output node of the second transistor, thereby creating an amplified output signal.

15. The method of claim 14, further comprising selecting the first delay to be equal to the second delay, such that the first and second delayed output signals are substantially in phase.

16. The method of claim 14, further comprising disabling the second transistor in a low power mode.

17. The method of claim 14, wherein the first output level control signal is a ramp signal.

18. The method of claim 16, further comprising:
applying a second output level control signal to a collector of the second transistor.

19. The method of claim 18, wherein the second output level control signal is a ramp signal.

20. The power amplifier of claim 1, comprising at least one first transistor and at least one second transistor.

* * * * *